(12) United States Patent
Gilda et al.

(10) Patent No.: US 11,062,903 B2
(45) Date of Patent: Jul. 13, 2021

(54) METHOD AND APPARATUS FOR MANUFACTURING SEMICONDUCTOR DEVICE

(71) Applicant: TAIWAN SEMICONDUCTOR MANUFACTURING COMPANY LTD., Hsinchu (TW)

(72) Inventors: Neena Avinash Gilda, Hsinchu (TW); Lien-Yao Tsai, Hsinchu (TW); Baohua Niu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/172,047

(22) Filed: Oct. 26, 2018

(65) Prior Publication Data

US 2020/0135446 A1    Apr. 30, 2020

(51) Int. Cl.
  *H01L 21/02* (2006.01)
  *H01L 21/68* (2006.01)
  *H01L 21/8222* (2006.01)

(52) U.S. Cl.
  CPC ......... *H01L 21/0231* (2013.01); *H01L 21/68* (2013.01); *H01L 21/8222* (2013.01)

(58) Field of Classification Search
  None
  See application file for complete search history.

(56) References Cited

U.S. PATENT DOCUMENTS

| | | | |
|---|---|---|---|
| 6,815,706 B2 * | 11/2004 | Li | H01L 51/428 257/14 |
| 9,102,521 B2 * | 8/2015 | Lieber | B82Y 10/00 |
| 2015/0154488 A1 * | 6/2015 | Heo | G06K 19/07728 235/488 |

OTHER PUBLICATIONS

Li etal (Optical Control of polarization in ferroelectric heterostructures. Nature communicatons,pp. 1-8).*

* cited by examiner

*Primary Examiner* — Ali Naraghi
(74) *Attorney, Agent, or Firm* — WPAT, P.C., Intellectual Property Attorneys; Anthony King (57) ABSTRACT

The present disclosure provides a method for manufacturing a semiconductor device. The method for manufacturing a semiconductor device includes the following operations. An intermediate layer is formed in the semiconductor device. A field is applied to the intermediate layer, wherein the field source does not contact the semiconductor device. The polarity of the intermediate layer is changed by the field to form a desired dipole orientation in the intermediate layer.

20 Claims, 8 Drawing Sheets

METHOD AND APPARATUS FOR MANUFACTURING SEMICONDUCTOR DEVICE

BACKGROUND

In a crystalline structure with several unit cells, dipoles are often randomly oriented. If the dipoles are randomly oriented in the crystalline structure of the piezoelectric or ferroelectric material, the piezoelectric effect exhibited by the piezoelectric or ferroelectric material will be negligible. To align the dipoles of a crystallized piezoelectric or ferroelectric material, the crystallized piezoelectric or ferroelectric material may be subjected to a process called poling so that the dipoles are oriented in a desired direction.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
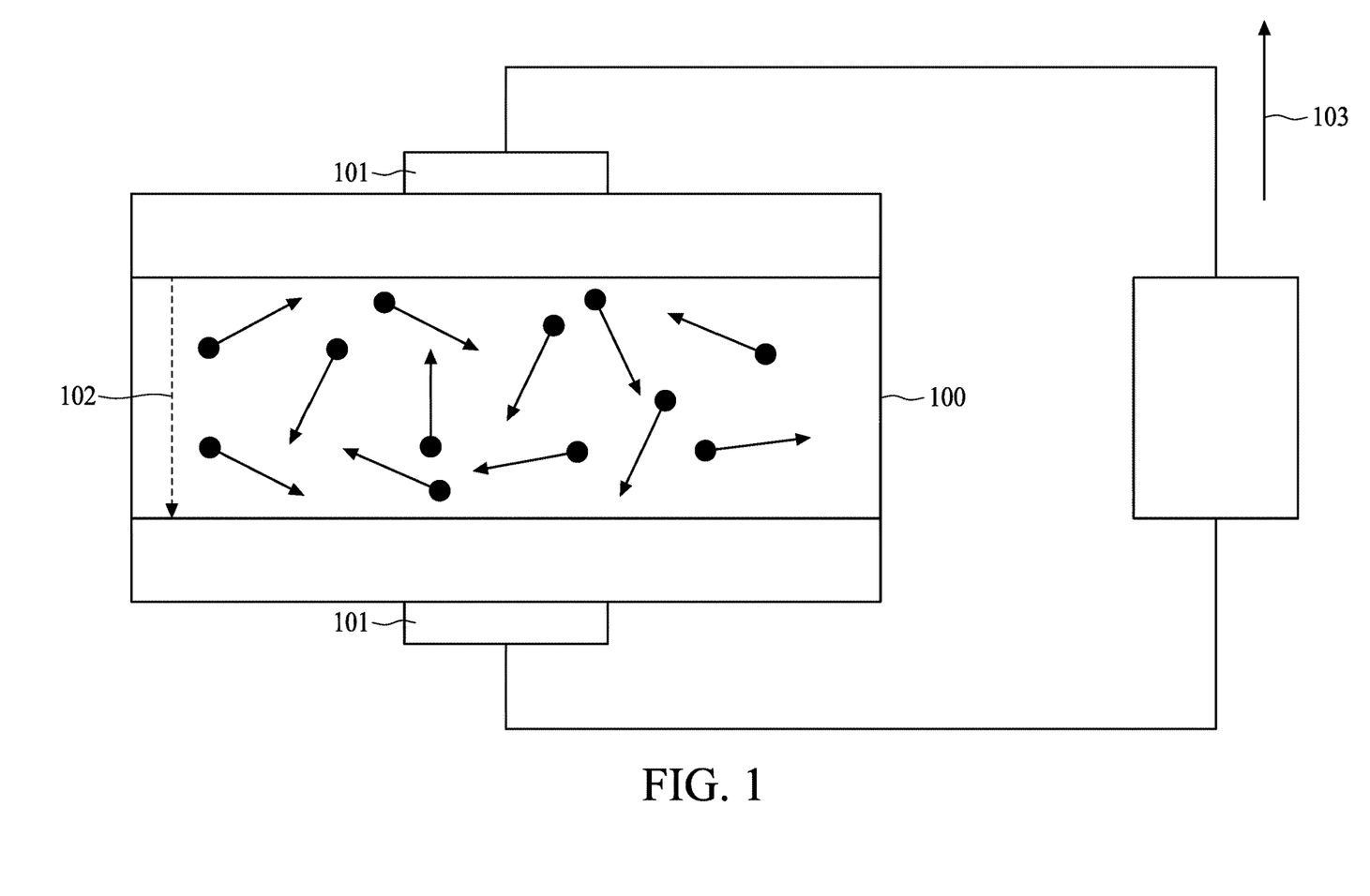
FIG. 1 is a schematic view of the dipoles oriented in random directions prior to the poling operation.

FIG. 1 is a schematic view of the dipoles oriented in random directions prior to the poling operation. When piezoelectric or ferroelectric materials are initially formed and crystallized, the dipole orientation of the dipoles may be random. In some cases, the piezoelectric or ferroelectric layer 100 in a semiconductor device may be polarized by direct-contact poling. In direct-contact poling, two separate electrodes 101 contact both sides of the piezoelectric or ferroelectric layer 100 of the semiconductor device and then apply a voltage 103 across the piezoelectric or ferroelectric layer 100. This causes an electric field 102 to develop within the piezoelectric or ferroelectric layer 100. However, in direct-contact poling operation, the electric field 102 can only provide the polarizing energy for the piezoelectric or ferroelectric layer 100 in one direction. Thus, if the orientations of the dipoles are approximately perpendicular to the electrical field 102, those dipoles may not be affected by the electric field 102 or may be only temporarily affected. As a result, the piezoelectric or ferroelectric layer 100 may not be polarized appropriately and thus may suffer from a long-term degradation issue.

The issues mentioned above may be alleviated according to the present disclosure. Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

According to some embodiments of the present disclosure, a field source is adopted to apply a field to the intermediate layer without contacting the semiconductor device, and therefore some issues of destruction caused by direct contact poling may be alleviated. Moreover, with the non-contact poling operation of the present disclosure, the semiconductor device may be polarized at either the wafer level or the device level. Also, the non-contact poling operation of the present disclosure may be performed on multiple semiconductor devices, may be performed at room temperature and may be more efficient compared to the direct contact poling. Further, the field source may provide the field in a perpendicular or parallel direction and the dipoles in the intermediate layer may thus be polarized more uniformly. The degradation issue of the intermediate layer may be alleviated.

Figure 2:
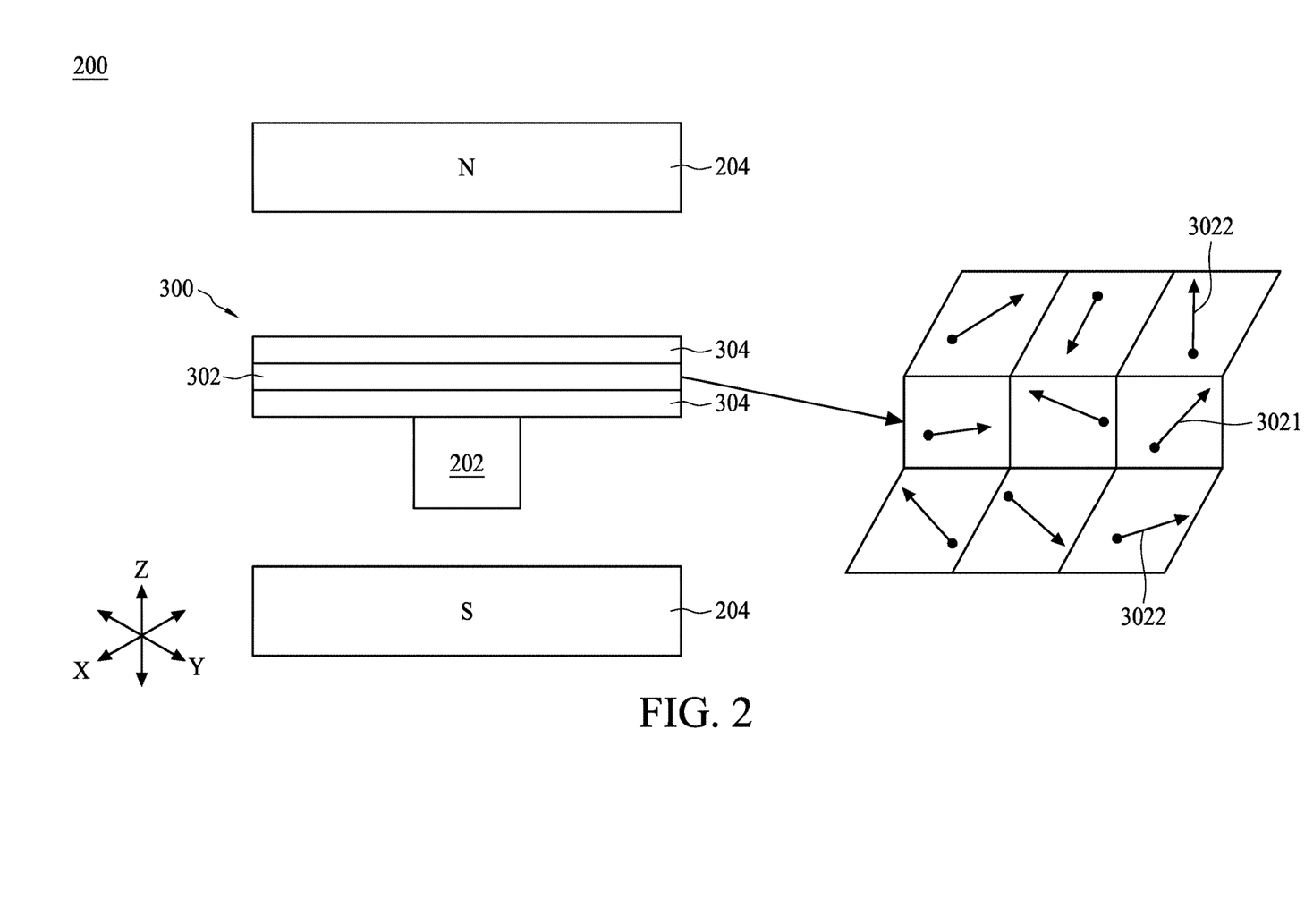
FIG. 2 is a schematic view of an apparatus for manufacturing a semiconductor device at some stages in accordance with some embodiments of the present disclosure.

FIG. 2 is a schematic view of an apparatus for manufacturing a semiconductor device at some stages in accordance with some embodiments of the present disclosure. Referring to FIG. 2, the apparatus 200 includes a pedestal 202 and a field source 204. The pedestal 202 supports a semiconductor device 300. The pedestal 202 may have a planar or substantially planar surface. In some embodiments, the pedestal 202 may be connected to an electrical ground (not shown in the figure).

The semiconductor device 300 includes an intermediate layer 302. The intermediate layer 302 may be a piezoelectric or ferroelectric layer. In some embodiments, the intermediate layer 302 may be sandwiched by two metal layers 304. The semiconductor device 300 may be, but is not limited to, a Micro-Electro-Mechanical Systems (MEMS) device. In some embodiments, the semiconductor device 300 may be a fixed-fixed micro-beam device, a micro-cantilever device, a micro-switch, or other device with piezoelectric or ferroelectric layer.

A material of the piezoelectric layer to be poled may be any suitable piezoelectric material. In some embodiments, ceramic-based piezoelectric materials may include but are not limited to such as barium titanate ($BaTiO_3$), lead zirconium titanate ($Pb(Zr_xTi_{1-x})O_3$), potassium niobate ($KNbO_3$), zinc oxide (ZnO), and bismuth ferrite ($BiFeO_3$). Other examples include but are not limited to polymer-based piezoelectric materials such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDF-TrFE. Other examples of piezoelectric materials that may be employed include polyvinylidene chloride (PVDC) homopolymers and copolymers, polytetrafluoroethylene (PTFE) homopolymers and copolymers, and diisopropylammonium bromide (DIPAB).

A material of the ferroelectric layer to be poled may be any suitable ferroelectric material. In some embodiments, the ferroelectric layer may include hafnium dioxide ($HfO_2$), hafnium silicide oxide (HfSiOx), hafnium zirconium oxide ($HfZrO_x$), aluminium oxide ($Al_2O_3$), titanium dioxide ($TiO_2$), lanthanum oxide ($LaO_x$), barium strontium titanate oxide ($BaSrTiO_x$, BST), lead zirconate titanate oxide ($PbZrTiO_x$, PZT), or the like, wherein value x is greater than zero and smaller than 1.

In some embodiments, the intermediate layer 302 includes a plurality of dipoles 3021 and 3022. Before a poling process, the dipole orientations of the first group of dipoles 3021 and the second group of dipoles 3022 are random. In some embodiments, the plurality of dipoles 3021 and 3022 may be at different plane. For example, the dipole orientation of the first group of dipoles 3021 may be aligned approximately parallel to the Z direction (i.e., Y-Z plane in FIG. 2) in 3D Cartesian coordinates and the dipole orientation of the second group of dipoles 3022 may be aligned approximately parallel to the X or Y direction (i.e., X-Y plane in FIG. 2) in the 3D Cartesian coordinates.

Figure 3:
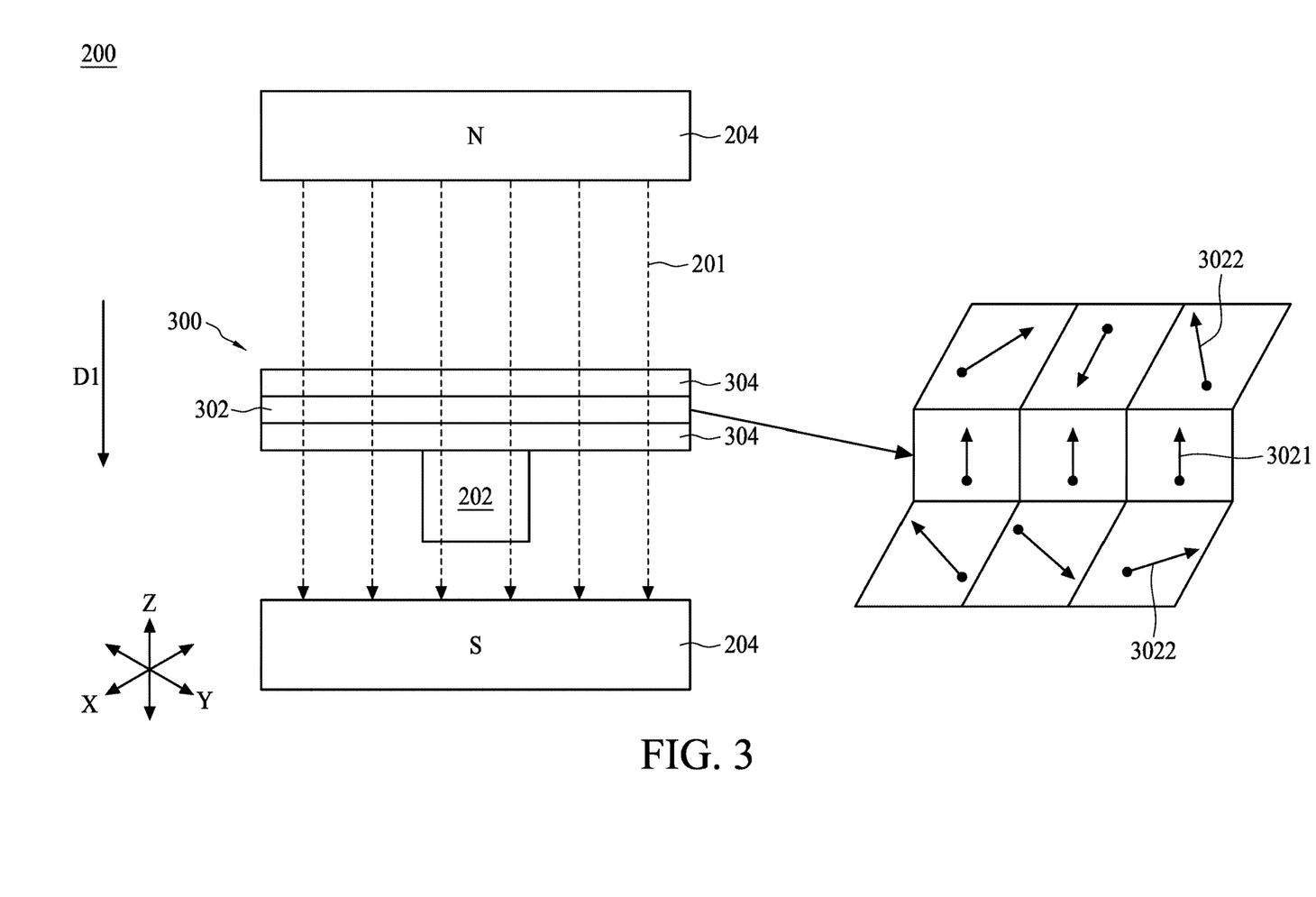
FIG. 3 is a schematic view of an apparatus for manufacturing a semiconductor device at some stages in accordance with some embodiments of the present disclosure.

FIG. 3 is a schematic view of an apparatus for manufacturing a semiconductor device at some stages in accordance with some embodiments of the present disclosure. Referring to FIG. 3, the field source 204 is proximal to the pedestal 202 for generating a field. The field source 204 forms a field surrounding the intermediate layer 302 without contacting the semiconductor device 300. In some embodiments, the field source 204 may be a light source or a magnetic field generator. As shown in FIG. 3, for example, the field source 204 may be a magnetic field generator. As the magnetic field generator, the field source 204 may include two magnets arranged such that a north pole N faces a south pole S. The magnet may be a permanent magnet or an electromagnet.

In some embodiments, the field source 204 provides the field (i.e., a magnetic field 201) in a first direction D1 to the intermediate layer 302. In some embodiments, the first direction D1 is parallel to the Z direction. As described above, the dipole orientation of the first group of dipoles 3021 may be aligned approximately in the Z direction and the dipole orientation of the second group of dipoles 3022 may be aligned approximately in the X or Y direction. Thus, the magnetic field 201 in the first direction D1 may affect the first group of dipoles 3021 more strongly than it affects the second group of dipoles 3022. In other words, the second group of dipoles 3022 may not be affected or may be only temporarily affected by the magnetic field 201. In some embodiments, the first group of dipoles 3021 thus may be aligned parallel to the magnetic field 201 in the first direction D1 (i.e., the Z direction). Under some conditions, the first group of dipoles 3021 may form a desired dipole orientation. In other words, the first group of dipoles 3021 may be in a stable state. The stable state is the energy state in which the first group of dipoles 3021 is at a lower energy state. The dipole orientation of the first group of dipoles 3021 may be more stable and more difficult to change.

Figure 4:
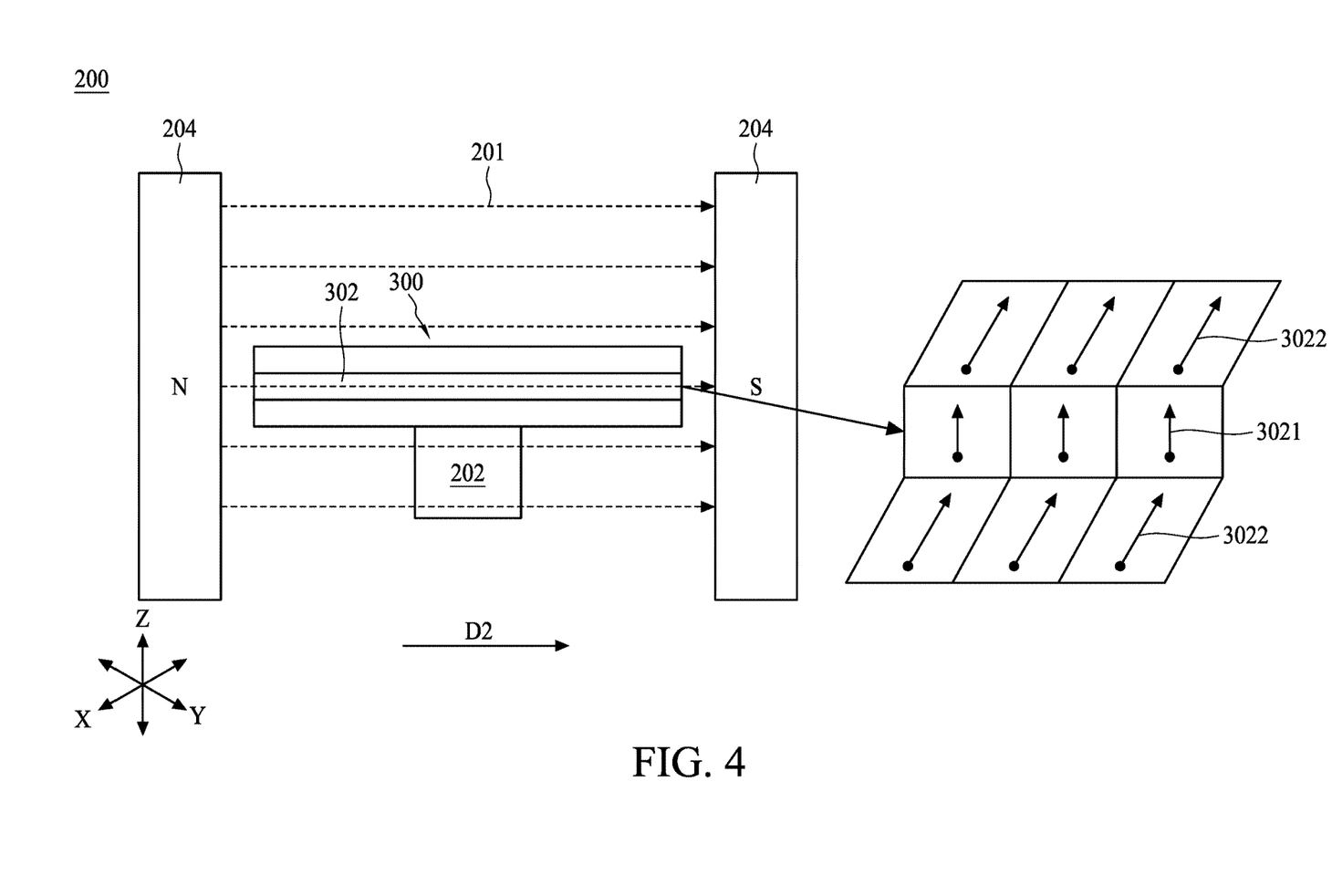
FIG. 4 is a schematic view of an apparatus for manufacturing a semiconductor device at some stages in accordance with some embodiments of the present disclosure.

FIG. 4 is a schematic view of an apparatus for manufacturing a semiconductor device at some stages in accordance with some embodiments of the present disclosure. Referring to FIG. 4, in some embodiments, the field source 204 provides the magnetic field 201 in a second direction D2 to the intermediate layer 302. The second direction D2 may be parallel to the X or Y direction. In some embodiments, the field source 204 may be rotated or moved to provide the magnetic field 201 in the second direction D2 (e.g., the X direction). In other embodiments, the field source 204 may have another set of magnets to provide the magnetic field 201 in the second direction D2. The set of magnets in the first direction D1 and the set of magnets in the second direction D2 may apply the magnetic field 201 alternatively or apply the magnetic field 201 in a predetermined time sequence. In still other embodiments, instead of rotating or moving the field source 204, the pedestal 202 is moved so that the magnetic field 201 is provided across the intermediate layer 302 in the second direction D2. The pedestal 202 may be moved in a predetermined time sequence. It should be noted that if the second direction D2 is parallel to the X direction, in the subsequent operation, the magnetic field 201 may be changed to the Y direction. Of course, if the second direction D2 is parallel to the Y direction, in the subsequent operation, the magnetic field 201 may be changed to the X direction.

Therefore, the magnetic field 201 in the second direction D2 may affect the second group of dipoles 3022 (aligned approximately in the X or Y direction) more strongly than it affects the first group of dipoles 3021. Further, the first group of dipoles 3021 may be in a stable state and thus may not be affected by the magnetic field 201 in the second direction D2. In some embodiments, the second group of dipoles 3022 thus may be aligned parallel to the magnetic field 201 in the second direction D2 (e.g., the X direction). The second group of dipoles 3022 may form a desired dipole orientation. In other words, the second group of dipoles 3022 may form a stable state. The stable state is the energy state in which the second group of dipoles 3022 is at a lower energy state. The dipole orientation of the second group of dipoles 3022 may be more stable and more difficult to change. It should be understood that the desired dipole orientation may be more than X, Y and Z directions and here is not intended to be limiting.

In summary, according to some embodiments of the present disclosure, since the field source 204 applies the field to the intermediate layer 302 without contacting the semiconductor device 300, some issues of destruction caused by direct contact poling may be alleviated. Moreover, with the non-contact poling operation of the present disclosure, the semiconductor device 300 may be polarized at either the wafer level or the device level. In other words, even the semiconductor device 300 is at device level, the non-contact poling operation still can be applied to the semiconductor device 300 without the issues of destruction caused by direct contact poling. Also, since the non-contact poling operation of the present disclosure applies a field that may cover a greater area than contact poling operation, it may be performed on multiple semiconductor devices 300.

In some embodiments, the non-contact poling operation may not need to raise the temperature and can be performed at room temperature. Thus, the non-contact poling operation of the present disclosure may be more efficient compared to the direct contact poling. It should be understood that the operation described in FIG. 2, FIG. 3 and FIG. 4 may also be performed at a predetermined temperature (e.g., Curie temperature of the intermediate layer 302) for a predetermined period for accelerating the poling operation. The predetermined period may be shorter than that of an existing poling operation and the harm caused by high temperature may be alleviated.

Further, the field source 204 may provide the magnetic field in a perpendicular or parallel direction and the dipoles 3021 and 3022 in the intermediate layer 302 may thus be polarized more uniformly. The degradation issue of the intermediate layer 302 may be alleviated. Moreover, since the field source 204 may apply the magnetic field 201 without contacting the semiconductor device 300, when the semiconductor device 300 is a MEMS device, the non-contact poling operation described above may be applied either before or after the semiconductor device 300 is released from a substrate.

Figure 5:
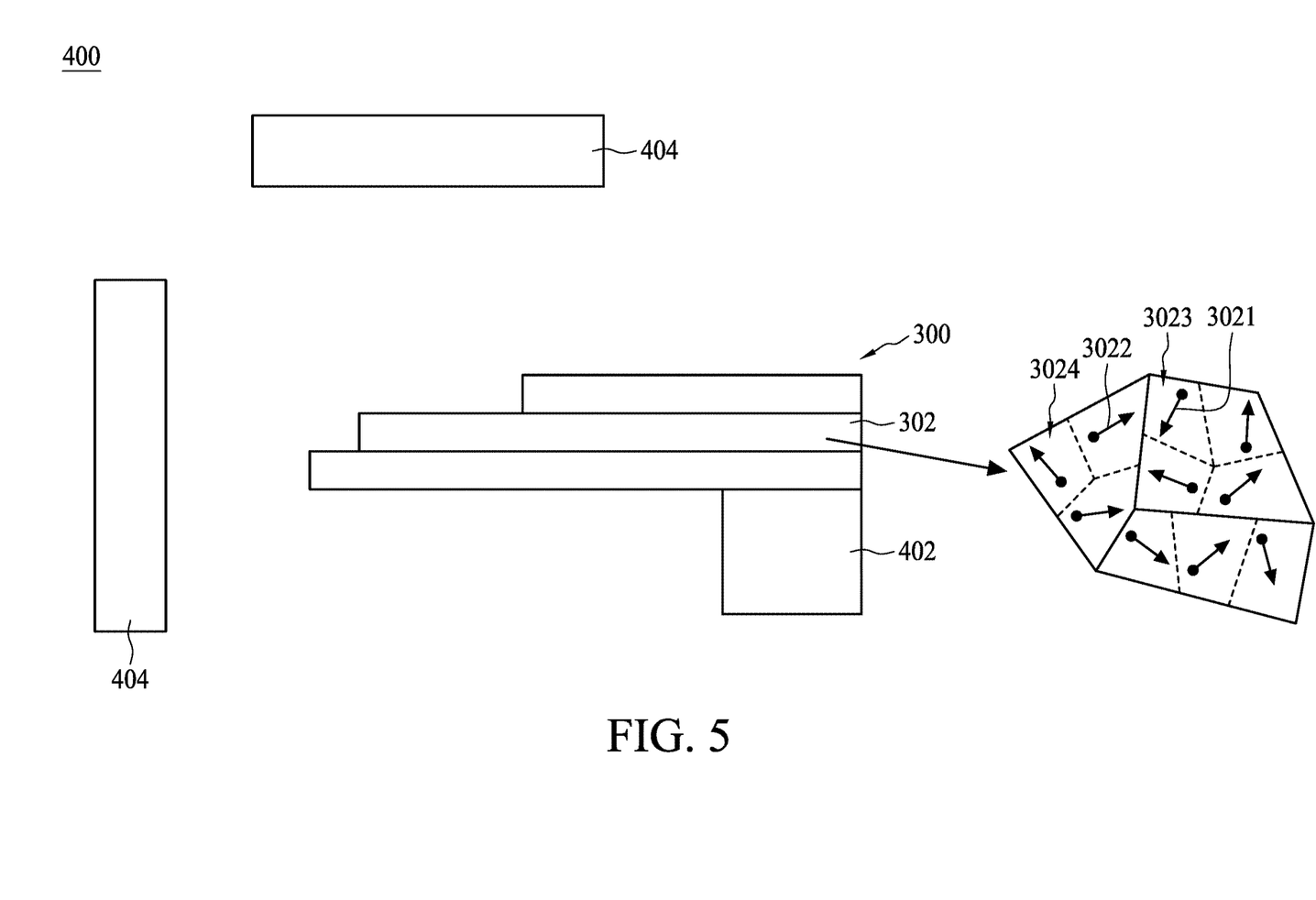
FIG. 5 is a schematic view of an apparatus for manufacturing a semiconductor device at some stages in accordance with some embodiments of the present disclosure.

FIG. 5 is a schematic view of an apparatus for manufacturing a semiconductor device at some stages in accordance with some embodiments of the present disclosure. Referring to FIG. 5, the apparatus 400 includes a pedestal 402 and a field source 404. The pedestal 402 supports the semiconductor device 300. The pedestal 402 may have a planar or substantially planar surface. In some embodiments, the pedestal 402 may be connected to an electrical ground (not shown in the figure). The difference between the apparatus 400 and the apparatus 200 in FIG. 2 is that the field source 404 is a light source.

As described above, the intermediate layer 302 may be a piezoelectric or ferroelectric layer. A material of the piezoelectric layer to be poled may be any suitable piezoelectric material. In some embodiments, ceramic-based piezoelectric materials may include but are not limited to such as barium titanate ($BaTiO_3$), lead zirconium titanate ($Pb(Zr_xTi_{1-x})O_3$), potassium niobate ($KNbO_3$), zinc oxide (ZnO), and bismuth ferrite ($BiFeO_3$). Other examples include but are not limited to polymer-based piezoelectric materials such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDF-TrFE. Other examples of piezoelectric materials that may be employed include polyvinylidene chloride (PVDC) homopolymers and copolymers, polytetrafluoroethylene (PTFE) homopolymers and copolymers, and diisopropylammonium bromide (DIPAB).

A material of the ferroelectric layer to be poled may be any suitable ferroelectric material. In some embodiments, the ferroelectric layer may include hafnium dioxide ($HfO_2$), hafnium silicide oxide (HfSiOx), hafnium zirconium oxide ($HfZrO_x$), aluminium oxide ($Al_2O_3$), titanium dioxide ($TiO_2$), lanthanum oxide ($LaO_x$), barium strontium titanate oxide ($BaSrTiO_x$, BST), lead zirconate titanate oxide ($PbZrTiO_x$, PZT), or the like, wherein value x is greater than zero and smaller than 1.

The intermediate layer 302 includes a plurality of dipoles 3021 and 3022. Before poling, the dipole orientations of the dipoles 3021 and 3022 are random. In some embodiments, the intermediate layer 302 may include a plurality of grains 3023 and 3024, and each grain 3023 or 3024 may have a plurality of dipoles 3021 and 3022. The grain may be a unit crystal structure in the intermediate layer 302. Before poling, the dipole orientations of the dipoles 3021 and 3022 are random, and each grain 3023 or 3024 may have a plurality of dipoles 3021 and 3022 with different dipole orientations.

Figure 6:
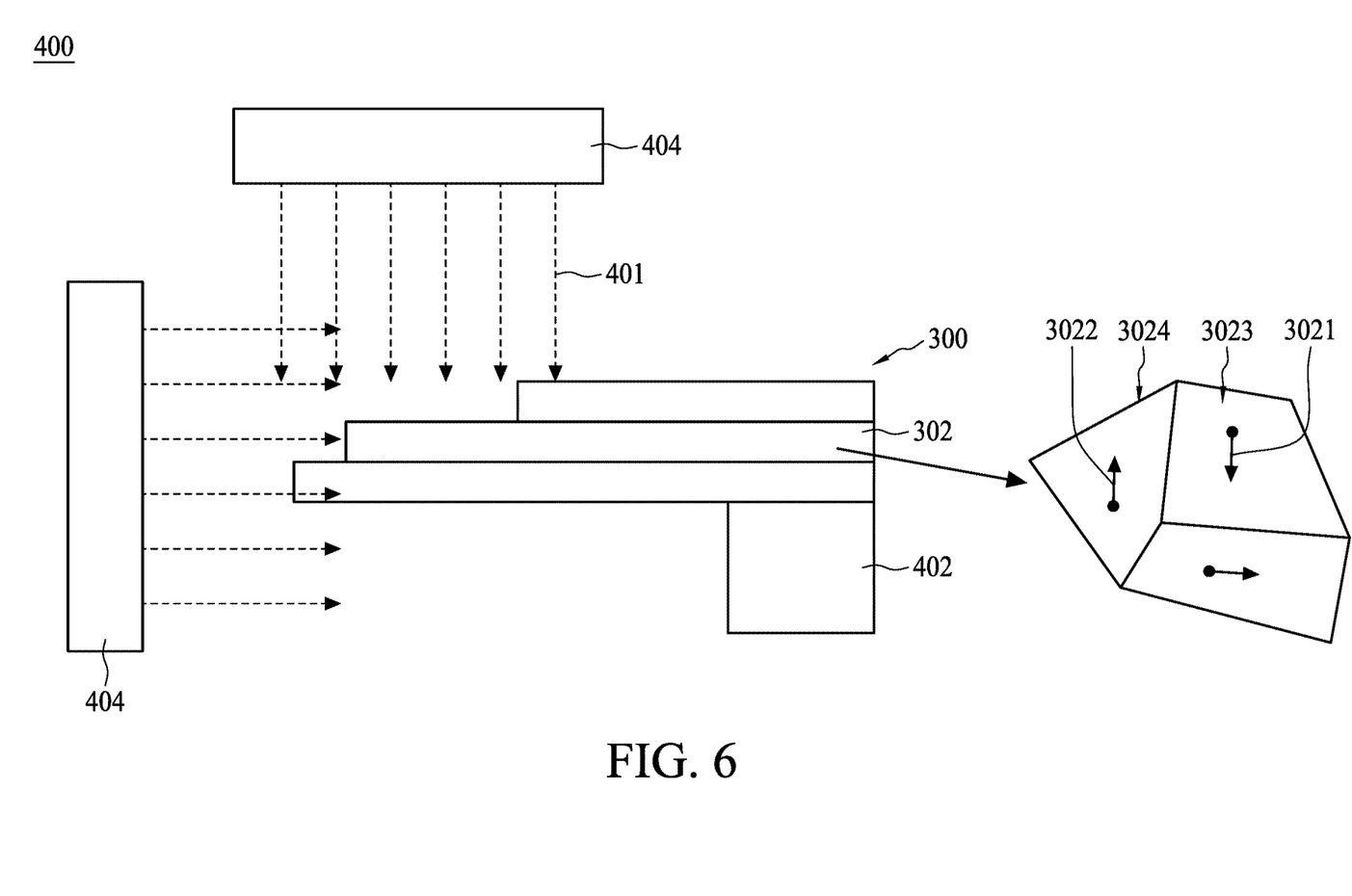
FIG. 6 is a schematic view of an apparatus for manufacturing a semiconductor device at some stages in accordance with some embodiments of the present disclosure.

FIG. 6 is a schematic view of an apparatus for manufacturing a semiconductor device at some stages in accordance with some embodiments of the present disclosure. Referring to FIG. 6, the field source 404 is proximal to the pedestal 402 for generating a field. The field source 404 forms a field surrounding the intermediate layer 302 without contacting the semiconductor device 300. As shown in FIG. 6, for example, the field source 404 is a light source. The field source 404 applies a light field 401 to the intermediate layer 302. The light field 401 provides a radiant energy to the dipoles in the intermediate layer 302. In some embodiments, at least a portion of the intermediate layer 302 is exposed to the light source. In some embodiments, the light source may be an ultraviolet light source. The radiant energy of the ultraviolet light source may be compatible with a direct band gap of the intermediate layer 302. Of course, here is as an example and is not intended to be limiting. The light source may be another spectrum range depending on the piezoelectric or ferroelectric material of the intermediate layer 302.

It should be noted that when the semiconductor device 300 is a MEMS device, the poling operation described here may be applied after the semiconductor device 300 is released from a substrate, since the intermediate layer 302 may need to be exposed to the light field 401 from the field source 404.

In some embodiments, the field source 404 may provide the light field from every direction to the intermediate layer 302. The radiant energy of the light field 401 is compatible with the direct band gap of the intermediate layer 302. Thus, the plurality of dipoles 3021 and 3022 may receive the radiant energy and form a stable state with the radiant energy. The stable state is the energy state in which the dipoles 3021 and 3022 are at a lower energy state. In other words, the dipoles 3021 and 3022 in each grain 3023 and 3024 may be aligned to the same direction and form a single desired dipole orientation. As a result, the dipole orientation of the dipoles 3021 and 3022 may be more stable and more difficult to change.

In summary, according to some embodiments of the present disclosure, since the field source 404 applies the light field 401 to the intermediate layer 302 without contacting the semiconductor device 300, some issues of destruction caused by direct contact poling may be alleviated. Moreover, with the non-contact poling operation of the present disclosure, the semiconductor device 300 may be polarized at the wafer level. Also, since the non-contact poling operation of the present disclosure applies a light field 401 that may cover a greater area than contact poling operation, it may be performed on multiple semiconductor devices 300.

In some embodiments, the non-contact poling operation may not need to raise the temperature and can be performed at room temperature. Thus, the non-contact poling operation of the present disclosure may be more efficient compared to the direct contact poling. It should be understood that the operation described in FIG. 5 and FIG. 6 may also be performed at a predetermined temperature (e.g., Curie temperature of the intermediate layer 302) for a predetermined period for accelerating the poling operation. The predetermined period may be shorter than that of an existing poling operation and the harm caused by high temperature may be alleviated. Further, the field source 404 may provide the light field 401 in every direction and the dipoles 3021 and 3022 in the intermediate layer 302 may thus be polarized more uniformly. The degradation issue of the intermediate layer 302 may be alleviated.

Figure 7:
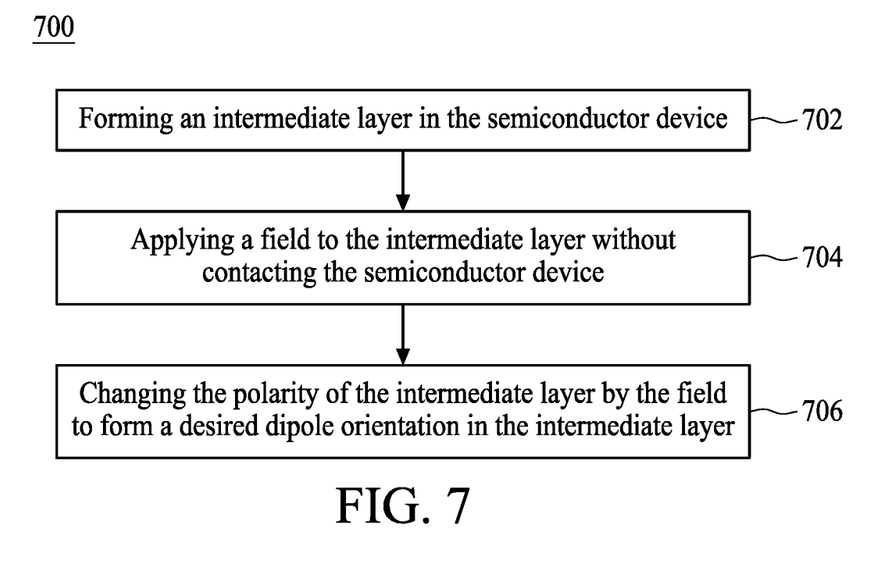
FIG. 7 is a flowchart illustrating a method for manufacturing a semiconductor device in accordance with some embodiments of the present disclosure.

FIG. 7 is a flowchart illustrating a method for manufacturing a semiconductor device in accordance with some embodiments of the present disclosure. The method 700 for manufacturing a semiconductor device may include operations 702, 704 and 706. In operation 702, an intermediate layer is formed in the semiconductor device. In operation 704, a field is applied to the intermediate layer, wherein the field source does not contact the semiconductor device. In operation 706, the polarity of the intermediate layer is changed by the field to form a desired dipole orientation in the intermediate layer. The detailed descriptions of such operations are similar to the descriptions of the operations shown in FIG. 2, FIG. 3, FIG. 4, FIG. 5 and FIG. 6, and thus are omitted for brevity.

Figure 8:
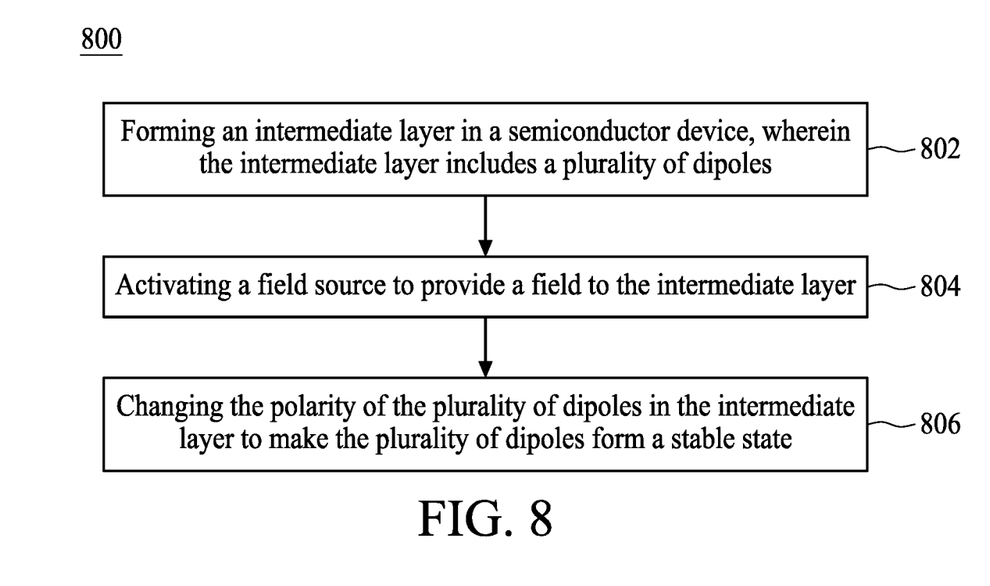
FIG. 8 is a flowchart illustrating a method for manufacturing a semiconductor device in accordance with some embodiments of the present disclosure.

FIG. 8 is a flowchart illustrating a method for manufacturing a semiconductor device in accordance with some embodiments of the present disclosure. The method 800 for manufacturing a semiconductor device may include operations 802, 804 and 806. In operation 802, an intermediate layer is formed in a semiconductor device. The intermediate layer includes a plurality of dipoles. In operation 804, a field source is activated to provide a field to the intermediate layer. In operation 806, the polarity of the plurality of dipoles in the intermediate layer is changed to make the plurality of dipoles form a stable state. The detailed descriptions of such operations are similar to the descriptions of the operations shown in FIG. 2, FIG. 3, FIG. 4, FIG. 5 and FIG. 6, and thus are omitted for brevity.

In summary, according to some embodiments of the present disclosure, since the field source applies the field to the intermediate layer without contacting the semiconductor device, some issues of destruction caused by direct contact poling may be alleviated. Moreover, with the non-contact poling operation of the present disclosure, the semiconductor device may be polarized at either the wafer level or the device level. In other words, even the semiconductor device is at device level, the non-contact poling operation still can be applied to the semiconductor device without the issues of destruction caused by direct contact poling. Also, since the non-contact poling operation of the present disclosure applies a field that may cover a greater area than contact poling operation, it may be performed on multiple semiconductor devices.

Furthermore, the non-contact poling operation may not need to raise the temperature and can be performed at room temperature. Thus, the non-contact poling operation of the present disclosure may be more efficient compared to the direct contact poling. On the other hand, the operation according to present disclosure may also be performed at a predetermined temperature (e.g., Curie temperature of the intermediate layer) for a predetermined period for accelerating the poling operation. The predetermined period may be shorter than that of an existing poling operation and the harm caused by high temperature may be alleviated.

Moreover, the field source may provide the field in desired direction and the dipoles in the intermediate layer may thus be polarized more uniformly. The degradation issue of the intermediate layer may be alleviated. Since the field source may apply the field without contacting the semiconductor device, when the semiconductor device is a MEMS device, the non-contact poling operation described above may be applied either before or after the semiconductor device is released from a substrate.

According to some embodiments, a method for manufacturing a semiconductor device is provided. The method for manufacturing a semiconductor device includes the following operations. An intermediate layer is formed in the semiconductor device. A field is applied to the intermediate layer, wherein the field source does not contact the semiconductor device. The polarity of the intermediate layer is changed by the field to form a desired dipole orientation in the intermediate layer.

According to other embodiments, a method for manufacturing a semiconductor device is provided. The method for manufacturing a semiconductor device includes the following operations. An intermediate layer is formed in a semiconductor device. The intermediate layer includes a plurality of dipoles. A field source is activated to provide a field to the intermediate layer. The polarity of the plurality of dipoles in the intermediate layer is changed to make the plurality of dipoles form a stable state.

According to other embodiments, an apparatus for manufacturing a semiconductor device is provided. The apparatus includes a pedestal and a field source. The pedestal supports a semiconductor device. The semiconductor device has an intermediate layer. The field source is proximal to the pedestal for generating a field without contacting the semiconductor device. The polarity of the intermediate layer is changed by the field to form a desired dipole orientation in the intermediate layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming an intermediate layer in the semiconductor device;
    applying a field to the intermediate layer without contacting the semiconductor device, comprising:
        applying a first field to the intermediate layer in a first direction; and
        applying a second field to the intermediate layer in a second direction different from the first direction; and
    changing the polarity of the intermediate layer by the field to form a desired dipole orientation in the intermediate layer.

2. The method of claim 1, wherein the applying of the field to the intermediate layer comprises:
    exposing the intermediate layer to a light source; and applying a light field to the intermediate layer.

3. The method of claim 2, wherein the light field provides a radiant energy to the intermediate layer.

4. The method of claim 3, wherein the intermediate layer includes a plurality of dipoles and the plurality of dipoles receive the radiant energy.

5. The method of claim 4, wherein the plurality of dipoles form a stable state with the radiant energy.

6. The method of claim 3, wherein the radiant energy is compatible with a direct band gap of the intermediate layer.

7. The method of claim 2, wherein the light source is an ultraviolet light source.

8. The method of claim 1, wherein the applying the first field to the intermediate layer in the first direction comprises:
providing a magnetic field in the first direction to the intermediate layer.

9. The method of claim 8, wherein the intermediate layer includes a first group of dipoles and a second group of dipoles.

10. The method of claim 9, wherein the changing of the polarity of the intermediate layer by the field in order to form the desired dipole orientation in the intermediate layer further comprises:
aligning the first group of dipoles with the magnetic field in the first direction to form the desired dipole orientation.

11. The method of claim 9, wherein the applying the second field to the intermediate layer in the second direction comprises:
providing the magnetic field in the second direction to the intermediate layer.

12. The method of claim 11, wherein the changing of the polarity of the intermediate layer by the field in order to form the desired dipole orientation in the intermediate layer further comprises:
aligning the second group of dipoles with the magnetic field in the second direction to form the desired dipole orientation.

13. A method for manufacturing a semiconductor device, comprising:
forming an intermediate layer by piezoelectric or ferroelectric materials in the semiconductor device, wherein the intermediate layer includes a plurality of dipoles;
activating a field source to provide a field to the intermediate layer, comprising:
applying a first field to the intermediate layer in a first direction; and
applying a second field to the intermediate layer in a second direction different from the first direction; and
changing the polarity of the plurality of dipoles in the intermediate layer to make the plurality of dipoles form a stable state.

14. The method of claim 13, wherein the field source is a light source.

15. The method of claim 14, wherein the light source is an ultraviolet (UV) light.

16. The method of claim 15, wherein a radiant energy of the UV light source is compatible with a direct band gap of the intermediate layer.

17. The method of claim 13, wherein the field source is a magnetic field generator.

18. An apparatus for manufacturing a semiconductor device, comprising:
a pedestal for supporting a semiconductor device, wherein the semiconductor device has an intermediate layer;
a first field source proximal to the pedestal for generating a first field in a first direction to the intermediate layer without contacting the semiconductor device; and
a second field source over the pedestal for generating a second field in a second direction to the intermediate layer without contacting the semiconductor device,
wherein the polarity of the intermediate layer is changed by the first field and the second field to form a desired dipole orientation in the intermediate layer.

19. The apparatus of claim 18, wherein the first field source and the second field source comprise light sources.

20. The apparatus of claim 18, wherein the first field source and the second field source comprise magnetic field generators.

* * * * *